(12) United States Patent  
Kim

(10) Patent No.: US 9,362,930 B1
(45) Date of Patent: Jun. 7, 2016

(54) ANALOG-TO-DIGITAL CONVERTER AND ANALOG-TO-DIGITAL CONVERSION METHOD

(71) Applicant: SK hynix Inc., Gyeonggi-do (KR)

(72) Inventor: Hong-Gyeom Kim, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/738,458

(22) Filed: Jun. 12, 2015

(30) Foreign Application Priority Data

Dec. 18, 2014 (KR) ........................ 10-2014-0183527

(51) Int. Cl.
*H03M 1/12* (2006.01)
*H03M 1/00* (2006.01)

(52) U.S. Cl.
CPC ............ *H03M 1/002* (2013.01); *H03M 1/1245* (2013.01)

(58) Field of Classification Search
CPC ........... H03M 1/14; H03M 1/56; H03M 1/66; H03M 1/1009; H03M 1/60; H03M 1/002; H03M 1/1245; H03M 1/64

USPC .................................................. 341/118, 155
See application file for complete search history.

(56) References Cited

U.S. PATENT DOCUMENTS

| 6,809,676 | B1 | 10/2004 | Younis et al. | |
|---|---|---|---|---|
| 6,885,324 | B1* | 4/2005 | Quinlan | H03M 1/109 341/118 |
| 7,068,199 | B2* | 6/2006 | Preisach | H03L 7/093 341/141 |
| 2012/0249850 | A1* | 10/2012 | Hagihara | H03M 1/14 348/302 |

FOREIGN PATENT DOCUMENTS

KR 101097646 12/2011

* cited by examiner

*Primary Examiner* — Jean B Jeanglaude
(74) *Attorney, Agent, or Firm* — IP & T Group LLP

(57) ABSTRACT

An analog-to-digital converter may include a voltage-controlled oscillator suitable for generating an oscillation wave with a frequency corresponding to an input voltage, a counter suitable for counting the activation number of the oscillation wave to generate a digital code, and an operation section setting unit suitable for setting an operation section of at least one of the voltage-controlled oscillator and the counter.

15 Claims, 3 Drawing Sheets

ANALOG-TO-DIGITAL CONVERTER AND ANALOG-TO-DIGITAL CONVERSION METHOD

CROSS-REFERENCE TO RELATED APPLICATIONS

The present application claims priority of Korean Patent Application No. 10-2014-0183527, filed on Dec. 18, 2014, which is incorporated herein by reference in its entirety.

BACKGROUND

1. Field

Exemplary embodiments of the present invention relate to an analog-to-digital converter and an analog-to-digital conversion method and, more particularly, to a technology for improving the accuracy of an analog-to-digital converter.

2. Description of the Related Art

As the size of a complementary metal-oxide-semiconductor (CMOS) device is reduced, the power supply voltage is also rapidly reduced. From the standpoint of a digital circuit, such a decrease in the power supply voltage is advantageous in that switching power is reduced, but since the signal-to-noise ratio (SNR) deteriorates due to the reduction in the analog circuit signal swing, circuit design becomes more difficult.

There are various types of analog-to-digital converters that convert output values of the analog circuit to digital values used in the digital circuit. Among them, a flash analog-to-digital converter (flash ADC), a pipe line analog-to-digital converter (pipe line ADC), an over-sampling analog-to-digital converter using delta-sigma conversion, and the like are used in application fields according to the respective characteristics thereof. In the analog-to-digital converters other than the flash analog-to-digital converter, an operational amplifier is used. However, as the power supply voltage is reduced, it is difficult to design operational amplifiers. Therefore, analog-to-digital converters without operational amplifiers have been researched. An analog-to-digital converter without an operational amplifier includes a voltage-controlled oscillator (VCO)-based analog-to-digital converter. In VCO-based analog-to-digital converters, a voltage-controlled oscillator, which is the most important block, is easily affected by Process, Voltage, and Temperature (PVT) variation.

SUMMARY

Various embodiments are directed to an analog-to-digital converter and an analog-to-digital conversion method, for improving operation accuracy of a voltage-controlled oscillator-based analog-to-digital converter.

In an embodiment, an analog-to-digital converter may include: a voltage-controlled oscillator suitable for generating an oscillation wave with a frequency corresponding to a level of an input voltage; a counter suitable for counting the activation number of the oscillation wave to generate a digital code; and an operation section setting unit suitable for setting an operation section of at least one of the voltage-controlled oscillator and the counter.

The operation section setting unit may include: a replica voltage-controlled oscillator suitable for generating a replica oscillation wave with a frequency corresponding to a level of a reference voltage; a replica counter suitable for counting the activation number of the replica oscillation wave to generate a replica digital code; and a comparator suitable for comparing the replica digital code with a preset code to generate an end signal for finishing operations of the voltage-controlled oscillator and the replica voltage-controlled oscillator.

At least one of the voltage-controlled oscillator and the counter may be deactivated when the end signal is activated. At least one of the replica voltage-controlled oscillator and the replica counter may be deactivated when the end signal is activated. The operation of the voltage-controlled oscillator may start at approximately the same time as the operation of the replica voltage-controlled oscillator.

In an embodiment, an analog-to-digital conversion method may include: generating an oscillation wave with a frequency corresponding to a level of an input voltage; generating a replica oscillation wave with a frequency corresponding to a level of a reference voltage; counting the activation number of the oscillation wave and generating a digital code; counting the activation number of the replica oscillation wave and generating a replica digital code; and ending an analog-to-digital conversion operation when a value of the replica digital code reaches a preset value.

The ending of the analog-to-digital conversion operation may include ending the generating of the oscillation wave, and the ending of the analog-to-digital conversion operation may further include ending the generating of the replica oscillation wave. The generating of the oscillation wave may start at approximately the same time as the generating of the replica oscillation wave.

In an embodiment, an analog-to-digital converter may include: a voltage-controlled oscillator suitable for generating an oscillation wave with a frequency corresponding to a level of an input voltage in response to an activation signal; a counter suitable for counting the activation number of the oscillation wave to generate a digital code; a replica voltage-controlled oscillator suitable for generating a replica oscillation wave with a frequency corresponding to a level of a reference voltage in response to the activation signal; a replica counter suitable for counting the activation number of the replica oscillation wave to generate a replica digital code; and an activation section suitable for generating the activation signal when a value of the replica digital code reaches a preset value.

In accordance with embodiments of the present invention, it is possible to improve operation accuracy of a voltage-controlled oscillator-based analog-to-digital converter.

DETAILED DESCRIPTION

Figure 1:
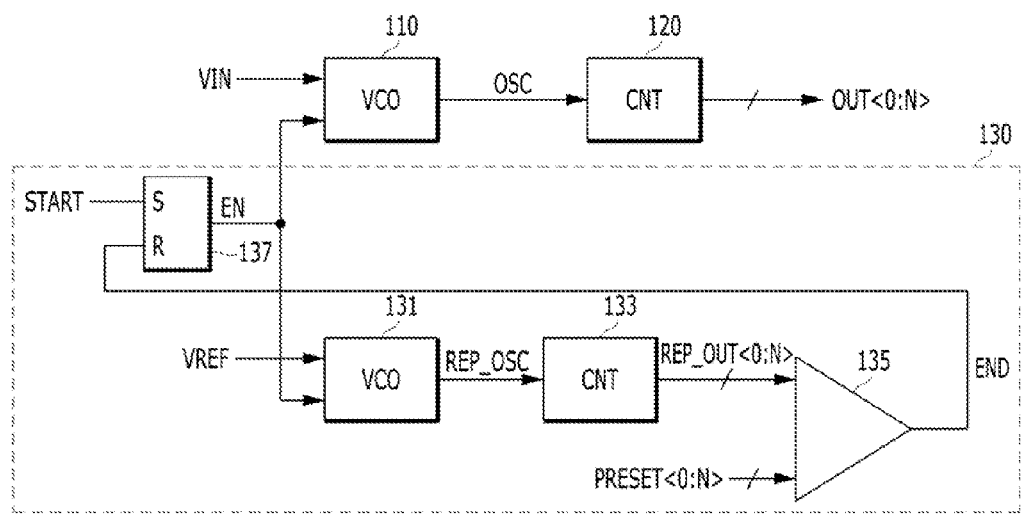
FIG. 1 is a block diagram illustrating an analog-to-digital converter in accordance with an embodiment of the present invention.

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts in the various figures and embodiments of the present invention.

FIG. 1 is a block diagram illustrating an analog-to-digital converter in accordance with an embodiment of the present invention.

Referring to FIG. 1, the analog-to-digital converter may include a voltage-controlled oscillator (VCO) 110, a counter 120, and an operation section setting unit 130.

The voltage-controlled oscillator 110 may generate an oscillation wave OSC with a frequency corresponding to a level of an input voltage VIN. As the level of the input voltage VIN becomes higher, the frequency of the oscillation wave OSC may become higher, and as the level of the input voltage VIN becomes lower, the frequency of the oscillation wave OSC may become lower. The input voltage VIN may have an analog value to be converted to a digital value by the analog-to-digital converter. The voltage-controlled oscillator 110 may be activated/deactivated in response to an activation signal EN.

The counter 120 may count the activation number of the oscillation wave OSC generated by the voltage-controlled oscillator 110, and generate digital codes OUT<0:N>. The digital codes OUT<0:N> are binary codes and may correspond to the activation number of the oscillation wave OSC. The digital codes OUT<0:N> may be obtained by converting the input voltage VIN of the analog value into the digital value.

The operation section setting unit 130 may set a section for an analog-to-digital conversion operation (hereinafter, referred to as an "analog-to-digital conversion operation section") of the voltage-controlled oscillator 110 and the counter 120. The operation section setting unit 130 may generate the activation signal EN and control the analog-to-digital conversion operation section of the voltage-controlled oscillator 110 and the counter 120 in response to the activation signal EN. Though FIG. 1 illustrates an example in which the analog-to-digital conversion operation section is controlled by activating/deactivating the voltage-controlled oscillator 110 in response to the activation signal EN, the analog-to-digital conversion operation section may be controlled by activating/deactivating the counter 120 in response to the activation signal EN. This is because a value of the digital codes OUT<0:N> may be fixed by deactivating the voltage-controlled oscillator 110 to prevent the oscillation wave OSC from being toggled, and the value of the digital codes OUT<0:N> may also be fixed by deactivating the counter 120. That is, the operation section setting unit 130 may activate/deactivate at least one of the voltage-controlled oscillator 110 and the counter 120 in response to the activation signal EN, thereby controlling the analog-to-digital conversion operation section.

The operation section setting unit 130 may include a replica voltage-controlled oscillator 131, a replica counter 133, a comparator 135, and an activation section 137.

The replica voltage-controlled oscillator 131 may generate a replica oscillation wave REP_OSC with a frequency corresponding to a level of a reference voltage VREF. The replica voltage-controlled oscillator 131 may be designed similarly to the voltage-controlled oscillator 110. Therefore, the voltage-controlled oscillator 110 and the replica voltage-controlled oscillator 131 may be similarly affected by Process, Voltage, and Temperature (PVT) variation. Preferably, the reference voltage VREF will remain constant, or at least approximately so. The replica voltage-controlled oscillator 131 may be activated/deactivated in response to the activation signal EN. Accordingly, an operation of the voltage-controlled oscillator 110 may start at approximately the same time as an operation of the replica voltage-controlled oscillator 131. Though FIG. 1 illustrates that the replica voltage-controlled oscillator 131 is activated/deactivated in response to the activation signal EN, at least one of the replica voltage-controlled oscillator 131 and the replica counter 133 may be activated/deactivated in response to the activation signal EN.

The replica counter 133 may count the activation number of the replica oscillation wave REP_OSC generated by the replica voltage-controlled oscillator 131, and generate replica digital codes REP_OUT<0:N>. The replica digital codes REP_OUT<0:N> are binary codes and may correspond to the activation number of the replica oscillation wave REP_OSC. The replica counter 133 may be designed similarly to the counter 120.

The comparator 135 may compare the replica digital codes REP_OUT<0:N> with preset codes PRESET<0:N>, and generate an end signal END. The comparator 135 may activate the end signal END when a value of the replica digital codes REP_OUT<0:N> is substantially equal to that of the preset codes PRESET<0:N>.

The activation section 137 may activate the activation signal EN in response to an activation of a start signal START, and deactivate the activation signal EN in response to an activation of the end signal END. The activation section 137 may be an SR latch.

Figure 2:
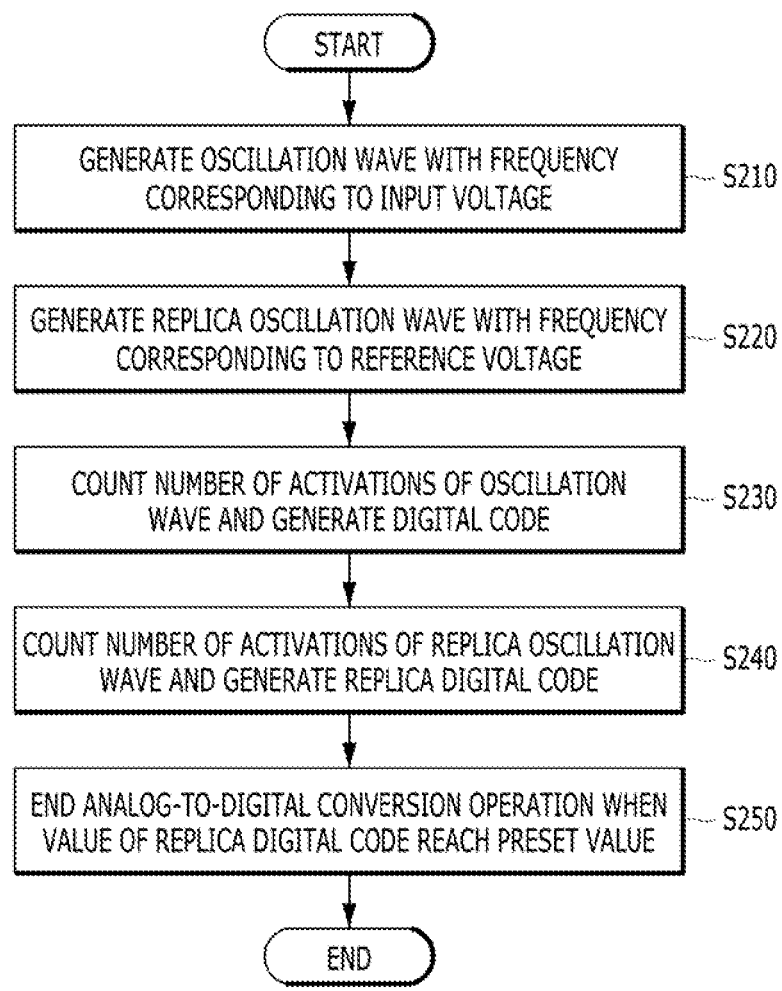
FIG. 2 is a flowchart illustrating an operation of the analog-to-digital converter of FIG. 1.
Figure 3:
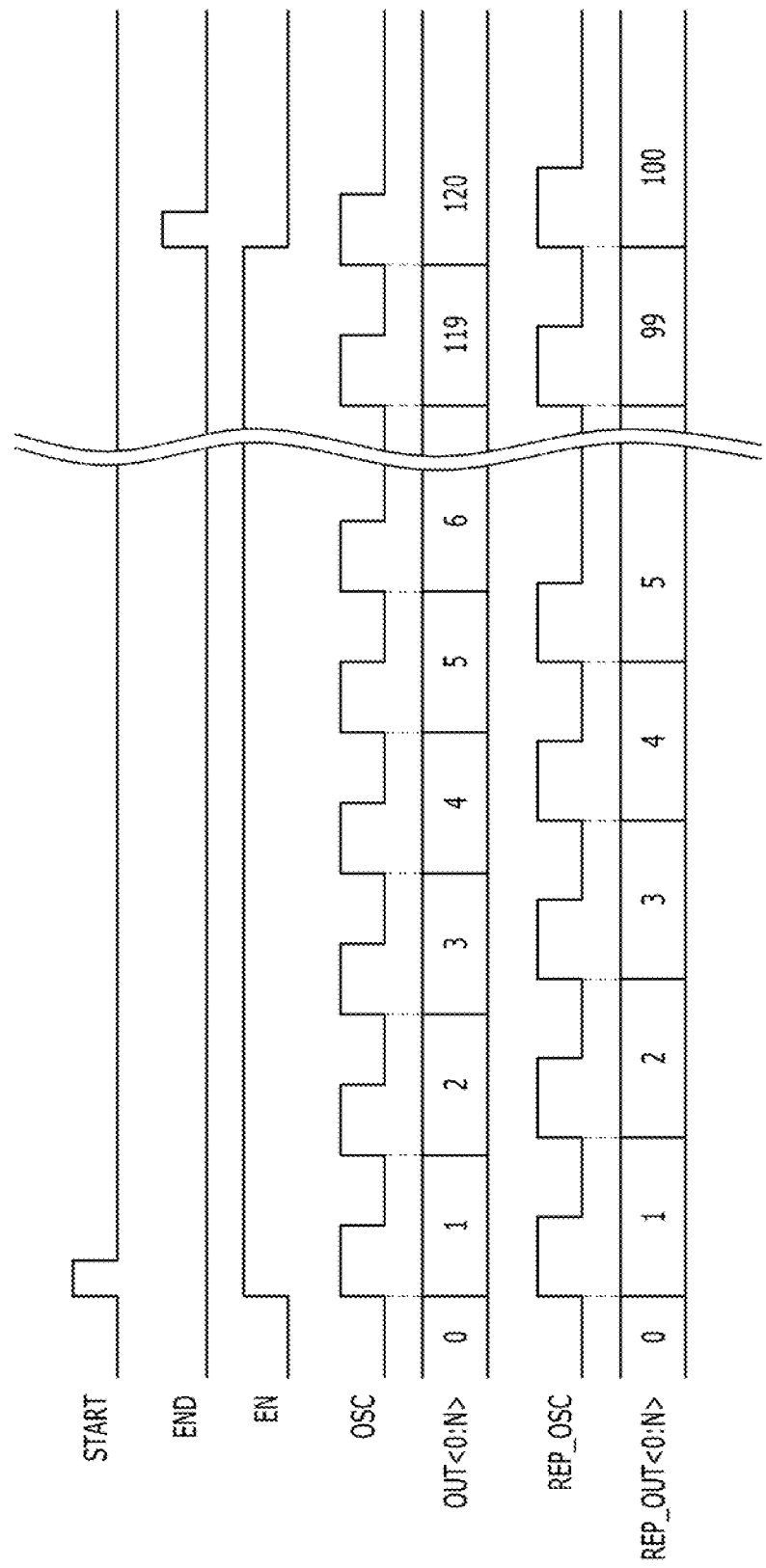
FIG. 3 is a timing diagram illustrating an operation of the analog-to-digital converter of FIG. 1.

FIG. 2 and FIG. 3 are a flowchart and a timing diagram illustrating an operation of the analog-to-digital converter of FIG. 1, respectively. With reference to FIG. 2 and ad FIG. 3, the operation of the analog-to-digital converter will be described.

When the start signal START is activated, the activation signal EN may be activated. In response to an activation of the activation signal EN, the oscillation wave OSC may be generated by the voltage-controlled oscillator 110 at step S210, and the replica oscillation wave REP_OSC may be generated by the replica voltage-controlled oscillator 131 at step S220. The oscillation wave OSC may have a frequency corresponding to the level of the input voltage VIN and the replica oscillation wave REP_OSC may have a frequency corresponding to the level of the reference voltage VREF. FIG. 3 illustrates that the level of the input voltage VIN is higher than that of the reference voltage VREF and thus the frequency of the oscillation wave OSC is higher than that of the replica oscillation wave REP_OSC.

When the oscillation wave OSC and the replica oscillation wave REP_OSC are generated, the counter 120 may count the activation number of the oscillation wave OSC and generate the digital codes OUT<0:N> at step S230, and the replica counter 133 may count the activation number of the replica oscillation wave REP_OSC and generate the replica digital codes REP_OUT<0:N> at step S240. FIG. 3 illustrates values obtained by converting the values of the digital codes OUT<0:N> and the replica digital codes REP_OUT<0:N>, which are composed of the binary codes, into decimal numbers. Referring to FIG. 3, it can be understood that the value of the digital codes OUT<0:N> is increased whenever the oscillation wave OSC is activated, and the value of the replica digital codes REP_OUT<0:N> is increased whenever the replica oscillation wave REP_OSC is activated.

When the value of the replica digital codes REP_OUT<0:N> is substantially equal to that of the preset codes PRESET<0:N>, for example, 100, the comparator 135 may activate the end signal END and the activation section 137 may deactivate the activation signal EN in response to the activation of the end signal END. In response to the deactivation of the activation signal EN, the voltage-controlled oscillator 110 may be deactivated and the analog-to-digital conversion operation may be stopped at step S250. The value of the digital codes OUT<0:N> at this time, for example, 120, may be a final output value obtained by converting the input voltage VIN of the analog value into the digital value.

The voltage-controlled oscillator 110 in the analog-to-digital converter may be sensitive to PVT variation. When the characteristics of the voltage-controlled oscillator 110 change according to the PVT variation, the characteristics of the replica voltage-controlled oscillator 131 also similarly change. Accordingly, the analog-to-digital converter may adjust a width of the analog-to-digital conversion operation section, that is, a width of an activation section of the activation signal EN such that the PVT variation is offset. That is, when the frequency of the oscillation wave OSC generated by the voltage-controlled oscillator 110 is decreased by the PVT variation, the width of the analog-to-digital conversion operation section is increased, so that the PVT variation may be offset. Furthermore, when the frequency of the oscillation wave OSC generated by the voltage-controlled oscillator 110 is increased by PVT variation, the width of the analog-to-digital conversion operation section is decreased, so that the PVT variation may be offset. Consequently, by reflecting the PVT variation on the voltage-controlled oscillator 110, it is possible to accurately perform the analog-to-digital conversion operation.

Although various embodiments have been described for illustrative purposes, it will be apparent to those skilled in the art that various changes and modifications may be made without departing from the spirit and scope of the invention as defined in the following claims.

What is claimed is:

1. An analog-to-digital converter comprising:
    a voltage-controlled oscillator suitable for generating an oscillation wave with a frequency corresponding to an input voltage;
    a counter suitable for counting the activation number of the oscillation wave to generate a digital code; and
    an operation section setting unit suitable for setting an operation section of at least one of the voltage-controlled oscillator and the counter,
    wherein the operation section setting unit comprises:
        a replica voltage-controlled oscillator suitable for generating a replica oscillation wave with a frequency corresponding to a reference voltage;
        a replica counter suitable for counting the activation number of the replica oscillation wave to generate a replica digital code; and
        a comparator suitable for comparing the replica digital code with a preset code to generate an end signal for finishing operations of the voltage-controlled oscillator and the replica voltage-controlled oscillator.

2. The analog-to-digital converter device of claim 1, wherein the replica voltage-controlled oscillator has a structure similar to the voltage-controlled oscillator, and the replica counter has a structure similar to the counter.

3. The analog-to-digital converter device of claim 1, wherein at least one of the voltage-controlled oscillator and the counter is deactivated when the end signal is activated.

4. The analog-to-digital converter device of claim 1, wherein at least one of the replica voltage-controlled oscillator and the replica counter is deactivated when the end signal is activated.

5. The analog-to-digital converter device of claim 1, wherein the operation of the voltage-controlled oscillator starts at approximately the same time as the operation of the replica voltage-controlled oscillator.

6. The analog-to-digital converter device of claim 1, wherein the operation section setting unit further comprises:
    an activation section suitable for activating an activation signal in response to a start signal, and deactivating the activation signal in response to the end signal,
    wherein the voltage-controlled oscillator and the replica voltage-controlled oscillator are activated/deactivated in response to the activation signal.

7. An analog-to-digital conversion method comprising:
    generating an oscillation wave with a frequency corresponding to an input voltage;
    generating a replica oscillation wave with a frequency corresponding to a reference voltage;
    counting the activation number of the oscillation wave and generating a digital code;
    counting the activation number of the replica oscillation wave and generating a replica digital code; and
    ending an analog-to-digital conversion operation when a value of the replica digital code reaches a preset value.

8. The analog-to-digital conversion method of claim 7, wherein the generating of the oscillation wave is started at approximately the same time as the generating of the replica oscillation wave.

9. The analog-to-digital conversion method of claim 7, wherein the ending of the analog-to-digital conversion operation includes ending the generating of the oscillation wave.

10. The analog-to-digital conversion method of claim 9, wherein the ending of the analog-to-digital conversion operation further includes ending the generating of the replica oscillation wave.

11. An analog-to-digital converter comprising:
    a voltage-controlled oscillator suitable for generating an oscillation wave with a frequency corresponding to an input voltage in response to an activation signal;
    a counter suitable for counting the activation number of the oscillation wave to generate a digital code;
    a replica voltage-controlled oscillator suitable for generating a replica oscillation wave with a frequency corresponding to a reference voltage in response to the activation signal;
    a replica counter suitable for counting the activation number of the replica oscillation wave to generate a replica digital code; and
    an activation section suitable for generating the activation signal when a value of the replica digital code reaches a preset value.

12. The analog-to-digital converter device of claim 11, wherein the replica voltage-controlled oscillator has a structure similar to the voltage-controlled oscillator, and the replica counter is has a structure similar to the counter.

13. The analog-to-digital converter device of claim 11, wherein the voltage-controlled oscillator and the replica voltage-controlled oscillator are deactivated when the value of the replica digital code reaches the preset value.

14. The analog-to-digital converter device of claim 11, wherein the counter outputs the digital code as a final digital value when the value of the replica digital code reaches the preset value.

15. The analog-to-digital converter device of claim 11, wherein an operation of the voltage-controlled oscillator starts at approximately the same time as that of the replica voltage-controlled oscillator.

* * * * *